United States Patent
Hwang et al.

(10) Patent No.: US 9,024,439 B2
(45) Date of Patent: May 5, 2015

(54) SUBSTRATES HAVING BUMPS WITH HOLES, SEMICONDUCTOR CHIPS HAVING BUMPS WITH HOLES, SEMICONDUCTOR PACKAGES FORMED USING THE SAME, AND METHODS OF FABRICATING THE SAME

(75) Inventors: In Chul Hwang, Icheon-si (KR); Il Hwan Cho, Icheon-si (KR); Ki Young Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 8 days.

(21) Appl. No.: 13/615,859

(22) Filed: Sep. 14, 2012

(65) Prior Publication Data
US 2013/0270694 A1    Oct. 17, 2013

(30) Foreign Application Priority Data
Apr. 16, 2012    (KR) .......................... 10-2012-0039224

(51) Int. Cl.
| H01L 23/48 | (2006.01) |
| H01L 21/00 | (2006.01) |
| H01L 21/44 | (2006.01) |
| H05K 1/11 | (2006.01) |
| H01L 23/00 | (2006.01) |
| H01L 23/498 | (2006.01) |

(Continued)

(52) U.S. Cl.
CPC .................. *H05K 1/11* (2013.01); *H01L 24/13* (2013.01); *H01L 24/16* (2013.01); *H01L 23/49811* (2013.01); *H01L 21/4853* (2013.01); *H01L 24/03* (2013.01); *H01L 24/05* (2013.01); *H01L 24/11* (2013.01); *H01L 24/81* (2013.01); *H01L 2224/11001* (2013.01); *H01L 2224/1147* (2013.01); *H01L 2224/13016* (2013.01); *H01L 2224/131* (2013.01); *H01L 2224/13147* (2013.01); *H01L 2224/1601* (2013.01); *H01L 2224/1607* (2013.01); *H01L 2224/16227* (2013.01); *H01L 2224/16238* (2013.01); *H01L 2224/81193* (2013.01); *H01L 2224/81815* (2013.01); *H01L 2224/03912* (2013.01); *H01L 2224/13011* (2013.01); *H05K 3/3436* (2013.01); *H05K 3/4007* (2013.01); *H05K 2201/0367* (2013.01); *H05K 2203/308* (2013.01); *H01L 2224/16225* (2013.01)

(58) Field of Classification Search
CPC ......... H01L 24/03; H01L 24/11; H01L 24/13; H01L 24/81; H01L 2224/03912; H01L 2224/81193; H01L 2224/81815; H01L 2224/16227; H01L 2224/1601; H01L 2227/1607
USPC ........... 257/737, E21.509, E21.575; 438/614, 438/615, 119
See application file for complete search history.

(56) References Cited

U.S. PATENT DOCUMENTS 5,329,423 A * 7/1994 Scholz ........................ 361/760
5,349,495 A * 9/1994 Visel et al. .................... 361/774

(Continued)

FOREIGN PATENT DOCUMENTS

KR    10-2010-0120869 A    11/2010

*Primary Examiner* — Long K Tran
*Assistant Examiner* — Dzung Tran
(74) *Attorney, Agent, or Firm* — William Park & Associates Ltd.

(57) ABSTRACT

Substrates and semiconductor chips are provided. The substrate or the semiconductor chip includes a body and a substantially pillar-shaped bump disposed on a first surface of the body. The pillar-shaped bump has a hole penetrating a portion thereof. Related semiconductor packages are also provided. Further, related methods are provided.

12 Claims, 7 Drawing Sheets

(51) Int. Cl.
*H01L 21/48* (2006.01)
*H05K 3/40* (2006.01)
*H05K 3/34* (2006.01)

(56) References Cited

U.S. PATENT DOCUMENTS

| | | | |
|---|---|---|---|
| 5,477,086 A * | 12/1995 | Rostoker et al. | 257/737 |
| 6,007,349 A * | 12/1999 | Distefano et al. | 439/71 |
| 6,059,172 A * | 5/2000 | Chapman et al. | 228/180.22 |
| 6,166,334 A * | 12/2000 | Galloway | 174/261 |
| 6,344,695 B1 * | 2/2002 | Murayama | 257/781 |
| 6,358,834 B1 | 3/2002 | Shieh | |
| 7,545,038 B2 | 6/2009 | Hu | |
| 7,579,692 B2 | 8/2009 | Matsushima | |
| 2003/0189260 A1 * | 10/2003 | Tong et al. | 257/778 |
| 2008/0073783 A1 * | 3/2008 | Matsushima et al. | 257/737 |
| 2012/0049389 A1 * | 3/2012 | Verma et al. | 257/786 |

* cited by examiner

SUBSTRATES HAVING BUMPS WITH HOLES, SEMICONDUCTOR CHIPS HAVING BUMPS WITH HOLES, SEMICONDUCTOR PACKAGES FORMED USING THE SAME, AND METHODS OF FABRICATING THE SAME

CROSS-REFERENCES TO RELATED APPLICATIONS

The present application claims priority under 35 U.S.C 119(a) to Korean Application No. 10-2012-0039224, filed on Apr. 16, 2012, in the Korean intellectual property Office, which is incorporated herein by reference in its entirety.

BACKGROUND

1. Field of Invention

Various embodiments of the present disclosure relate to substrates used in the fabrication of semiconductor packages and, also to substrates having bumps with holes, semiconductor chips having bumps with holes, semiconductor packages formed using the same, and methods of fabricating the same.

2. Related Art

Semiconductor chips may be formed on a semiconductor substrate (e.g., a semiconductor wafer) using various unit processes such as: a deposition process, an etching process, a diffusion process, an implantation process, and the like. The semiconductor chips may be evaluated by an electrical test and may be encapsulated or packaged using an assembly process. The assembly process may include mounting each semiconductor chip on a package substrate having external terminals and molding the semiconductor chip to protect it from an external environment. The external terminals may be electrically connected to the semiconductor chip using a wire bonding technique or a bump bonding technique (also, referred to as a flip chip bonding technique).

According to the wire bonding technique, a semiconductor chip may be mounted on a lead frame having a plurality of leads and pads of the semiconductor chip may be electrically connected to the leads through wires such as golden wires. Each of the leads may include an inner lead and an outer lead. The wires may be bonded to the inner leads. According to the bump bonding technique, protruding bumps may be formed on respective pads of the semiconductor chip or respective pads of a package substrate, and the pads of the semiconductor chip may be electrically connected to the pads of the package substrate using the bumps. If the bump bonding technique is used in the assembly process, the semiconductor chip may directly come in contact with the package substrate without use of the bonding wires. Thus, the semiconductor packages that are fabricated using the bump bonding technique can be scaled down in size as compared with the semiconductor packages that are fabricated using the wire bonding technique. Further, the bump bonding technique may lead to minimization of the lengths of interconnection lines between the semiconductor chip and the package substrate. Thus, the impedance of the interconnection lines may be reduced to improve the operation speed of a semiconductor package including the semiconductor chip. Accordingly, there is an increasing demand for the bump bonding technique in assembly processes.

The bumps used in the bump bonding technique may be conductive protrusions for electrically connecting a semiconductor chip to a package substrate with a tape automated bonding (TAB) manner or a flip chip manner or for electrically connecting a ball grid array (BGA) package and/or a chip size package (CSPs) to a circuit board. The bumps may include a gold material. However, in general, the bumps may be formed of a solder material containing lead and tin. Alternatively, the bumps may be formed of an alloy containing tin, silver, and copper. The bumps may have two major roles. One is to increase heights of pads of a semiconductor chip for facilitation of a flip chip package process, and the other is to facilitate the physical contacts between the pads of the semiconductor chip and external terminals of a package substrate.

As the semiconductor packages are continuously scaled down, distances between the bumps have been reduced to increase the probability of electrical shortage between the bumps. This is because a solder material is evenly formed on sidewalls of the bumps when the bumps of the semiconductor chip are bonded to the bumps of the package substrate using the solder material. In addition, when the semiconductor packages are scaled down, adhesion between the bumps of the semiconductor chip and the bumps of the package substrate may affect the reliability of the semiconductor package more.

SUMMARY

Embodiments are directed to substrates having bumps with holes, semiconductor chips having bumps with holes, semiconductor packages formed using the same, and methods of fabricating the same.

According to various embodiments, a substrate includes a substrate body and a substantially pillar-shaped bump disposed on a first surface of the substrate body. The pillar-shaped bump has a hole penetrating a portion thereof.

In various embodiments, the substantially pillar-shaped bump may include a conductive material.

In various embodiments, the hole horizontally may penetrate the substantially pillar-shaped bump to be substantially parallel with the first surface of the substrate body.

According to further embodiments, a semiconductor chip includes a chip body and a substantially pillar-shaped bump disposed on a first surface of the chip body. The substantially pillar-shaped bump has a hole penetrating a portion thereof.

In various embodiments, the substantially pillar-shaped bump may include a conductive material.

In various embodiments, the hole horizontally may penetrate the substantially pillar-shaped bump to be substantially parallel with the first surface of the chip body.

According to various embodiments, a semiconductor package includes a substrate, a semiconductor chip, and an adhesive agent bonding the substrate to the semiconductor chip. The substrate has a substrate body and a substantially pillar-shaped bump disposed on a first surface of the substrate body, and the substantially pillar-shaped bump has a hole that penetrates a portion thereof. The semiconductor chip has a chip body and a conductive electrode pattern disposed on a first surface of the chip body. The adhesive agent substantially fills the hole of the bump and bonds the conductive electrode pattern to the substantially pillar-shaped bump.

In various embodiments, the conductive electrode pattern may include a bump.

In various embodiments, the adhesive agent may include a solder material.

According to various embodiments, a semiconductor package includes a semiconductor chip, a substrate and an adhesive agent bonding the semiconductor chip to the substrate. The semiconductor chip has a chip body and a substantially pillar-shaped bump disposed on a first surface of the chip body, and the substantially pillar-shaped bump having a hole that penetrates a portion thereof. The substrate has a substrate body and a conductive electrode pattern disposed on a first surface of the substrate body. The adhesive agent substantially fills the hole and bonds the conductive electrode pattern to the substantially pillar-shaped bump.

In various embodiments, the conductive electrode pattern may include a bump.

In various embodiments, the adhesive agent may include a solder material.

According to various embodiments, a method of forming a substrate includes forming a lower bump on a substrate body, forming a sacrificial pattern on the lower bump, forming an upper bump on the lower bump to substantially surround a portion of the sacrificial pattern, and removing the sacrificial pattern to form a hole in a bump including the lower bump and the upper bump.

In various embodiments, the lower bump and the upper bump may be formed using a plating process.

In various embodiments, the sacrificial pattern may be removed using a chemical solution.

According to various embodiments, a method of forming a semiconductor chip includes forming a lower bump on a chip body, forming a sacrificial pattern on the lower bump, forming an upper bump on the lower bump to substantially surround a portion of the sacrificial pattern, and removing the sacrificial pattern to form a hole in a bump including the lower bump and the upper bump.

In various embodiments, the lower bump and the upper bump may be formed using a plating process.

In various embodiments, the sacrificial pattern may be removed using a chemical solution.

According to various embodiments, a method of forming a semiconductor package includes forming a substrate that has a substrate body and a substantially pillar-shaped bump disposed on a first surface of the substrate body. The substantially pillar-shaped bump is formed to have a hole penetrating a portion thereof. A conductive electrode pattern is formed on a chip body, and an adhesive agent is formed on a first surface of the conductive electrode pattern substantially opposite to the chip body. The conductive electrode pattern is bonded to the substantially pillar-shaped bump by reflowing the adhesive agent. When the adhesive agent is reflowed, the hole is substantially filled with the adhesive agent.

In various embodiments, the conductive electrode pattern may be formed to include a metal bump.

In various embodiments, the adhesive agent may be formed to include a solder material.

In various embodiments, the adhesive agent may be reflowed at a temperature of about 200° C. to about 300° C. for about five minutes to about ten minutes.

According to various embodiments, a method of forming a semiconductor package includes forming a semiconductor chip that has a chip body and a substantially pillar-shaped bump disposed on a first surface of the chip body. The substantially pillar-shaped bump is formed to have a hole penetrating a portion thereof. A conductive electrode pattern is formed on a substrate body, and an adhesive agent is formed on a first surface of the conductive electrode pattern substantially opposite to the substrate body. The conductive electrode pattern is bonded to the substantially pillar-shaped bump by reflowing the adhesive agent. When the adhesive agent is reflowed, the hole is substantially filled with the adhesive agent.

In various embodiments, the conductive electrode pattern may be formed to include a metal bump.

In various embodiments, the adhesive agent may be formed to include a solder material.

In various embodiments, the adhesive agent may be reflowed at a temperature of about 200° C. to about 300° C. for about five minutes to about ten minutes.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF THE EMBODIMENTS

Various embodiments are described below with reference to the accompanying drawings. Many different forms and embodiments are possible without deviating from the spirit and teachings of this disclosure and so the disclosure should not be construed as limited to the various embodiments set forth herein. Rather, these various embodiments are provided so that this disclosure will be thorough and complete, and will convey the scope of the disclosure to those skilled in the art. In the drawings, the sizes and relative sizes of layers and regions may be exaggerated for clarity. The same reference numerals or the same reference designators denote the same elements throughout the specification.

Figure 1A:
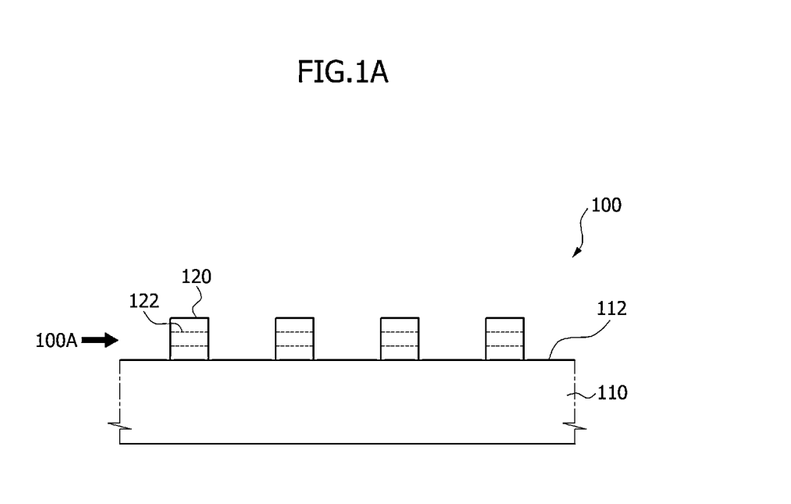
FIG. 1A is a cross sectional view illustrating a substrate with bumps according to an embodiment.
Figure 1B:
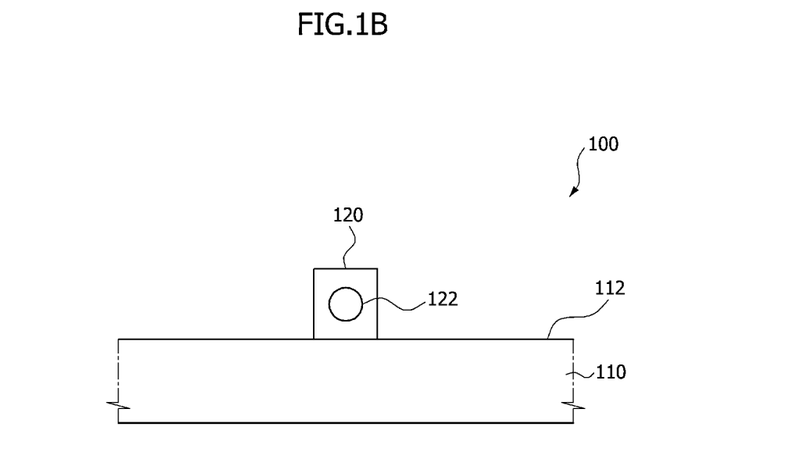
FIG. 1B is a side view of a substrate illustrated in FIG. 1A when viewed in a direction of an arrow '100A' in FIG. 1A.

FIG. 1A is a cross sectional view illustrating a substrate with bumps according to an embodiment, and FIG. 1B is a side view of a substrate illustrated in FIG. 1A when viewed in a direction of an arrow '100A' in FIG. 1A. Referring to FIGS. 1A and 1B, a substrate 100 according to an embodiment may include a substrate body 110 and bumps 120, that may be substantially pillar-shaped and disposed on a first surface 112 of the substrate body 110. In various embodiments, the substrate 100 may be a substrate on which at least one semiconductor package is mounted. Alternatively, the substrate 100 may be a substrate to which at least one semiconductor chip is attached. Although not illustrated in the drawings, connection members such as solder balls may be disposed on a second surface of the substrate body 110 substantially opposite to the bumps 120 and first surface 112. In such a case, circuit interconnections (not illustrated) may be disposed in the substrate body 110 to electrically connect the bumps 120 to the solder balls.

The bumps 120 may be electrically connected to, at least, one semiconductor chip or to, at least, one semiconductor package which may be mounted on the substrate 100. Accordingly, the bumps 120 may be formed of a conductive material, for example, a copper material. Further, each of the bumps 120 may be formed to have a hole 122 that penetrates a portion thereof. The holes 122 may horizontally penetrate the bumps 120 in a direction which may be substantially parallel with the first surface 112 of the substrate body 110. In various embodiments, the holes 122 may have substantially circular shapes and may have substantially the same diameter, when viewed from a side view. Alternatively, the holes 122 may have substantially circular shapes and may have different diameters from each other. In various embodiments, the holes 122 may have substantially polygonal shapes when viewed from a side view. The area of the cross-section of the hole is smaller than the remaining area of the cross-section of the pillar-shaped bump.

The bumps 120 may be electrically connected to a semiconductor chip or a semiconductor package mounted on the substrate 100 through a solder material. If the bumps 120 have the holes 122, the solder material may substantially fill the holes 122 when the bumps 120 are bonded to the semiconductor chip (or the semiconductor package). Thus, a bonding strength between the substrate 100 and the semiconductor chip (or the semiconductor package) may be improved, and a thickness of the solder material formed on sidewalls of the bumps 120 may be minimized. Advantageously, electrical bridges or shortages between the adjacent bumps 120 may be suppressed, and the solder material may be formed to substantially have a uniform shape after the bumps 120 are bonded to the semiconductor chip (or the semiconductor package). As a result, the bonding reliability of the substrate 100 may be enhanced.

Figure 2A:
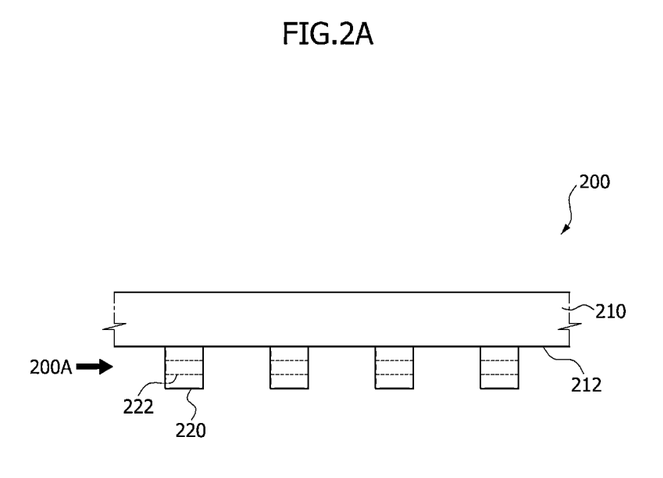
FIG. 2A is a cross sectional view illustrating a semiconductor chip with bumps according to an embodiment.
Figure 2B:
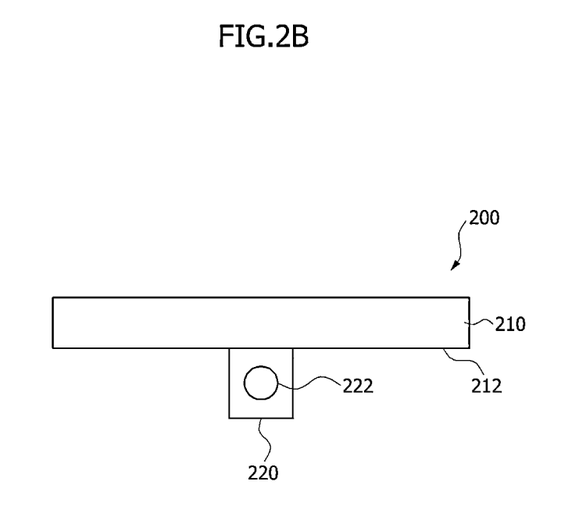
FIG. 2B is a side view of a semiconductor chip illustrated in FIG. 2A when viewed in a direction of an arrow '200A' in FIG. 2A.

FIG. 2A is a cross sectional view illustrating a semiconductor chip with bumps according to an embodiment, and FIG. 2B is a side view of a semiconductor chip illustrated in FIG. 2A when viewed in a direction of an arrow '200A' in FIG. 2A. Referring to FIGS. 2A and 2B, a semiconductor chip 200 according to an embodiment may include a chip body 210 and bumps 220, that may be substantially pillar-shaped and disposed on a first surface 212 of the chip body 210. The chip body 210 may include a semiconductor material such as a silicon material. In various embodiments, the chip body 210 may be one of a plurality of chips which are formed on a semiconductor wafer and separated from each other using a die sawing technique. The chip body 210 may include active elements and/or passive elements. The active elements may correspond to transistors, and the passive elements may correspond to inductors, capacitors and/or resistors. Further, at least one through electrode, for example, at least one through silicon via (TSV) may penetrate the chip body 210 to act as an electrical interconnection member. The through electrode may be electrically connected to at least one of the bumps 220.

The semiconductor chip 200 may be mounted on a substrate (not illustrated). In such a case, the bumps 220 may act as interconnections that electrically connect the chip body 210 to the substrate. Alternatively, the bumps 220 may act as interconnections that electrically connect a plurality of chip bodies to each other. In an embodiment, the bumps 220 may be formed of a conductive material, for example, a copper material. Each of the bumps 220 may be formed to have a hole 222 that penetrates a portion thereof. The holes 222 may horizontally penetrate the bumps 220 in a direction which is substantially parallel with the first surface 212 of the chip body 210. In various embodiments, the holes 222 may have circular shapes and may have substantially the same diameter, when viewed from a side view. Alternatively, the holes 222 may have substantially circular shapes and may have different diameters from each other. In various embodiments, the holes 222 may have substantially polygonal shapes when viewed from a side view.

The bumps 220 may be electrically connected to a substrate or another chip body through a solder material. If the bumps 220 have the holes 222, the solder material may substantially fill the holes 222 when the bumps 220 are bonded to the substrate or the other chip body. Thus, a bonding strength between the semiconductor chip 200 and the substrate (or the other chip body) may be improved, and a thickness of the solder material formed on sidewalls of the bumps 220 may be minimized. Advantageously, electrical bridges or shortages between the adjacent bumps 220 may be suppressed, and the solder material may be formed to substantially have a uniform shape after the bumps 220 are bonded to the substrate (or the other chip body). As a result, the bonding reliability of the semiconductor chip 200 may be enhanced.

Figure 3A:
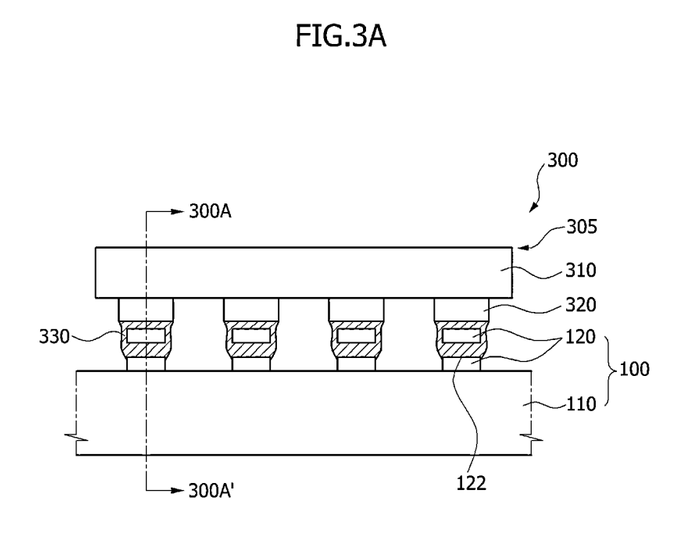
FIG. 3A is a cross sectional view illustrating a semiconductor package with bumps according to an embodiment.
Figure 3B:
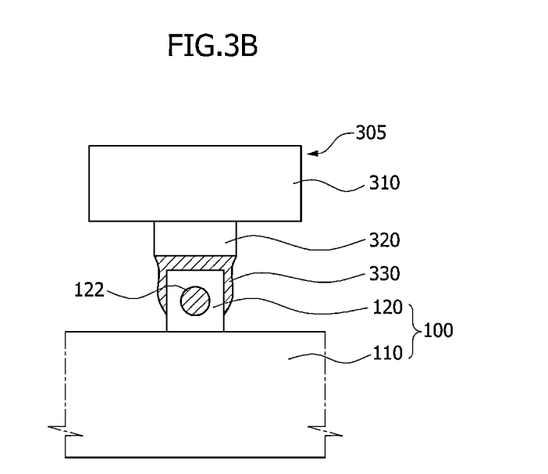
FIG. 3B is a cross sectional view taken along a line 300A-300A' of FIG. 3A.

FIG. 3A is a cross sectional view illustrating a semiconductor package with bumps according to an embodiment, and FIG. 3B is a cross sectional view taken along a line 300A-300A' of FIG. 3A. Referring to FIGS. 3A and 3B, a semiconductor package 300 according to an embodiment may include a substrate 100 and a semiconductor chip 305 having a chip body 310 mounted on the substrate 100. The substrate 100 may include a substrate body 110 and bumps 120, that may be substantially pillar-shaped and disposed on a first surface of the substrate body 110, and conductive electrode patterns 320 may be disposed on a first surface of the semiconductor chip 305. Each of the bumps 120 may have a hole 122 penetrating a portion thereof. The conductive electrode patterns 320 may be bonded to the bumps 120 through adhesive agents 330 filling the holes 122. That is, the conductive electrode patterns 320 may be electrically connected to the bumps 120 through the adhesive agents 330 substantially filling the holes 122. The substrate 100 including the bumps 120 may have substantially the same configuration as described with reference to FIG. 1A and 1B.

In various embodiments, each of the conductive electrode patterns 320 may be a bump. Alternatively, each of the conductive electrode patterns 320 may be a conductive pad. Each of the adhesive agents 330 may include a solder material. According to an embodiment, because the bumps 120 have the holes 122, the adhesive agents 330 may substantially fill the holes 122 when the bumps 120 are bonded to the conductive electrode patterns 320. Thus, a bonding strength between the bumps 120 and the conductive electrode patterns 320 may be improved, and a thickness of the adhesive agents 330 formed on sidewalls of the bumps 120 may be minimized. Advantageously, electrical bridges or shortages between the adjacent bumps 120 may be suppressed, and the adhesive agents 330 may be formed to have a substantially uniform shape after the bumps 120 are bonded to the conductive electrode patterns 320. As a result, the bonding reliability of the semiconductor package 300 may be enhanced.

Figure 4A:
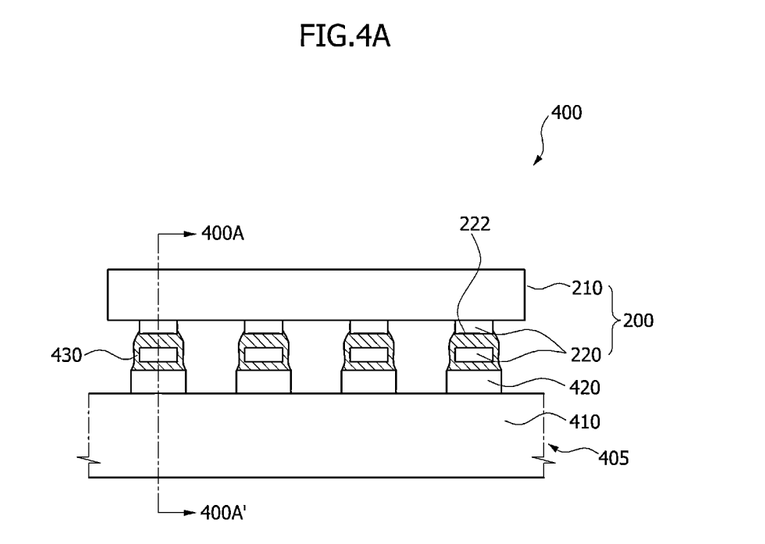
FIG. 4A is a cross sectional view illustrating a semiconductor package with bumps according to an embodiment.
Figure 4B:
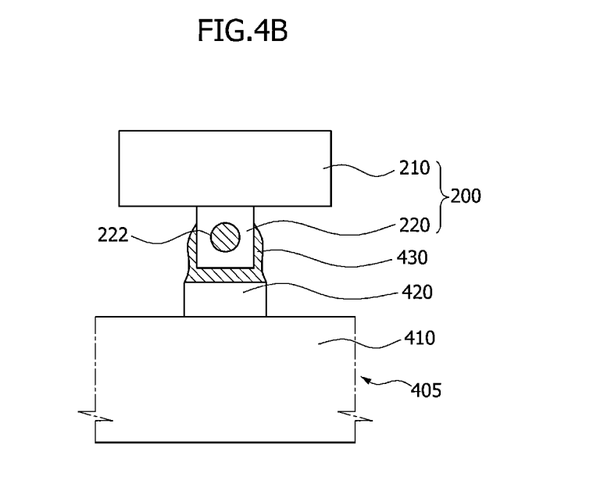
FIG. 4B is a cross sectional view taken along a line 400A-400A' of FIG. 4A.

FIG. 4A is a cross sectional view illustrating a semiconductor package with bumps according to an embodiment, and FIG. 4B is a cross sectional view taken along a line 400A-400A' of FIG. 4A. Referring to FIGS. 4A and 4B, a semiconductor package 400 according to an embodiment may include a substrate 405 having a substrate body 410 and a semiconductor chip 200 mounted on the substrate body 410. The semiconductor chip 200 may include a chip body 210 and bumps 220, that may be substantially pillar-shaped and disposed on a first surface of the chip body 210, and conductive electrode patterns 420 may be disposed on a first surface of the substrate body 410. Each of the bumps 220 may have a hole 222 penetrating a portion thereof. The conductive electrode patterns 420 may be bonded to the bumps 220 through adhesive agents 430 substantially filling the holes 222. That is, the conductive electrode patterns 420 may be electrically connected to the bumps 220 through the adhesive agents 430 substantially filling the holes 222. The semiconductor chip 200 including the bumps 220 may substantially have the same configuration as described with reference to FIG. 2A and 2B.

In various embodiments, each of the conductive electrode patterns 420 may be a bump. Alternatively, each of the conductive electrode patterns 420 may be a conductive pad. Each of the adhesive agents 430 may include a solder material. According to an embodiment, because the bumps 220 have the holes 222, the adhesive agents 430 may substantially fill the holes 222 when the bumps 220 are bonded to the conductive electrode patterns 420. Thus, a bonding strength between the bumps 220 and the conductive electrode patterns 420 may be improved, and a thickness of the adhesive agents 430 formed on the sidewalls of the bumps 220 may be minimized. Advantageously, electrical bridges or shortages between the adjacent bumps 220 may be suppressed, and the adhesive agents 430 may be formed to substantially have a uniform shape after the bumps 220 are bonded to the conductive electrode patterns 420. As a result, the bonding reliability of the semiconductor package 400 may be enhanced.

Figure 5:
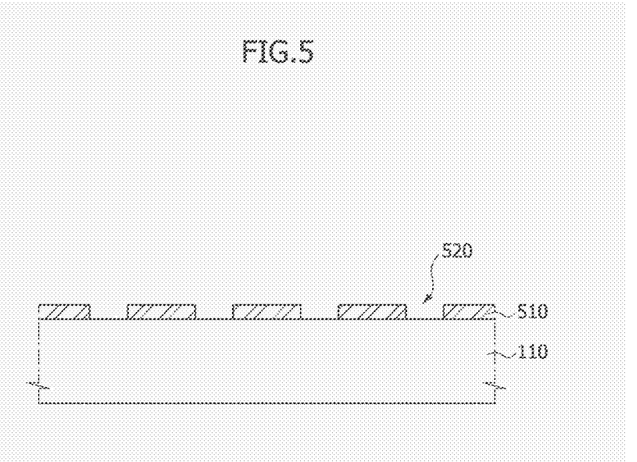
FIGS. 5, 6A, 6B, 7A and 7B are cross sectional views illustrating a method of fabricating the substrate illustrated in FIGS. 1A and 1B.
Figure 6A:
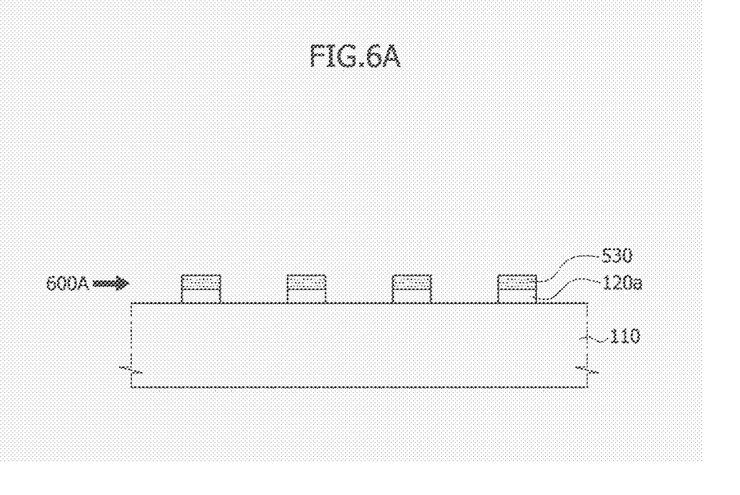
Figure 6B:
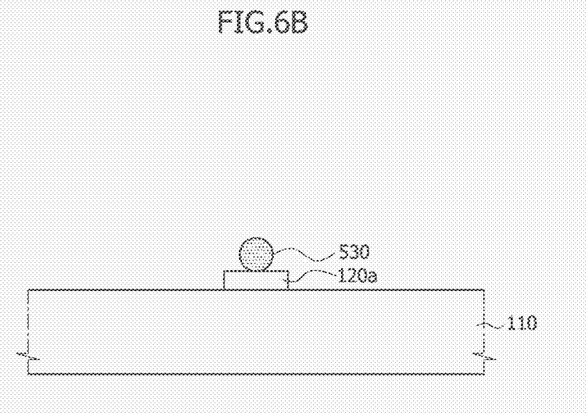
Figure 7A:
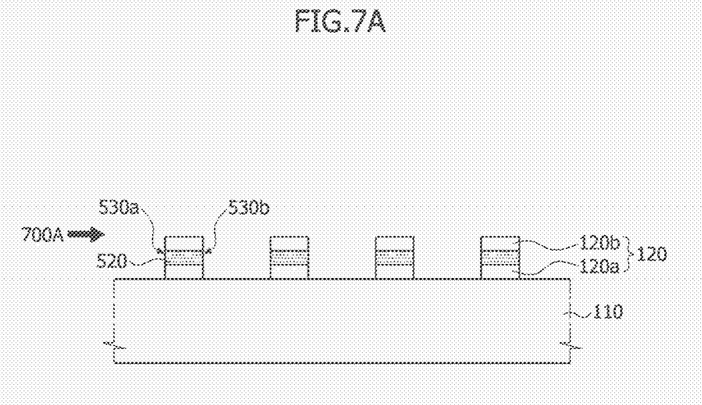
Figure 7B:
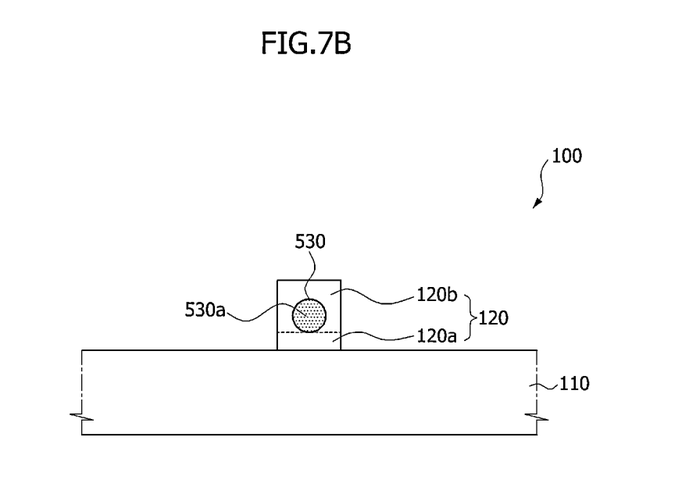

FIGS. 5, 6A and 7A are cross sectional views illustrating a method of fabricating the substrate illustrated in FIGS. 1A and 1B. FIG. 6B is a side view when viewed in a direction of an arrow indicated by a reference designator '600A' of FIG. 6A, and FIG. 7B is a side view when viewed in a direction of an arrow indicated by a reference designator '700A' of FIG. 7A. As illustrated in FIG. 5, a metal seed layer (not illustrated) may be formed on a surface of a substrate body 110 and a resist pattern 510 having openings 520 may be formed on the metal seed layer. The openings 520 of the resist pattern 510 may expose portions of the metal seed layer, thereby defining positions where bumps may be formed. In various embodiments, the metal seed layer may be formed after formation of the resist pattern 510. The resist pattern 510 may be formed of a photoresist material or a solder resist material. Alternatively, the resist pattern 510 may be formed of an insulation film.

As illustrated in FIGS. 6A and 6B, lower bumps 120a substantially filling the openings (520 of FIG. 5) may be formed using a plating process, and the resist pattern (510 of FIG. 5) may be removed. During removal of the resist pattern 510, the metal seed layer under the resist pattern 510 may also be removed. When the metal seed layer is formed after formation of the resist pattern 510, the lower bumps 120a may be formed after formation of the metal seed layer. Subsequently, sacrificial patterns 530 may be formed on respective ones of the lower bumps 120a.

The sacrificial patterns 530 may be formed of a material that can be more readily removed in a subsequent process. In an embodiment, the sacrificial patterns 530 may be formed of a material that may be removed by a chemical solution. For example, the sacrificial patterns 530 may be formed of a photoresist material. That is, the sacrificial patterns 530 may be formed by coating a photoresist layer on substantially an entire surface of the substrate after removal of the resist pattern 510, exposing the photoresist layer with a photo mask, and developing the exposed photoresist layer with a developer. The sacrificial patterns 530 may be formed to substantially have a circular shape when viewed from a side view, for example FIG. 6B, but is not limited thereto. For example, the sacrificial patterns 530 may be formed to substantially have a rectangular shape, a polygonal shape, or a hemispherical shape. According to an embodiment, the sacrificial patterns 530 may be formed after removal of the resist patterns 510. However, in various embodiments, the resist patterns 510 may be removed after formation of the sacrificial patterns 530 if the resist patterns 510 can be selectively removed without loss of the sacrificial patterns 530.

As illustrated in FIGS. 7A and 7B, a metal layer may be grown using the lower bumps 120a as seed layers, thereby forming upper bumps 120b that substantially cover and/or substantially surround the sacrificial patterns 530. In an embodiment, the upper bumps 120b may be formed using a plating process. If each of the sacrificial patterns 530 is formed to have a substantially horizontal bar shape with both ends 530a and 530b and a circumference surface 520 between both ends 530a and 530b, the upper bumps 120b may be formed to substantially surround the circumference surfaces of the openings 520 of the sacrificial patterns 530 and to expose the ends 530a and 530b of the sacrificial patterns 530. The lower bumps 120a and the upper bumps 120b may constitute bumps 120. Subsequently, the sacrificial patterns 530 may be removed using a chemical solution, thereby forming holes (122 of FIGS. 1A and 1B) that horizontally penetrate the bumps 120.

Although an embodiment is described in conjunction with a method of fabricating the substrate 100 illustrated in FIGS. 1A and 1B, an embodiment may be equally applicable to a method of fabricating the semiconductor chip 200 illustrated in FIGS. 2A and 2B.

Figure 8:
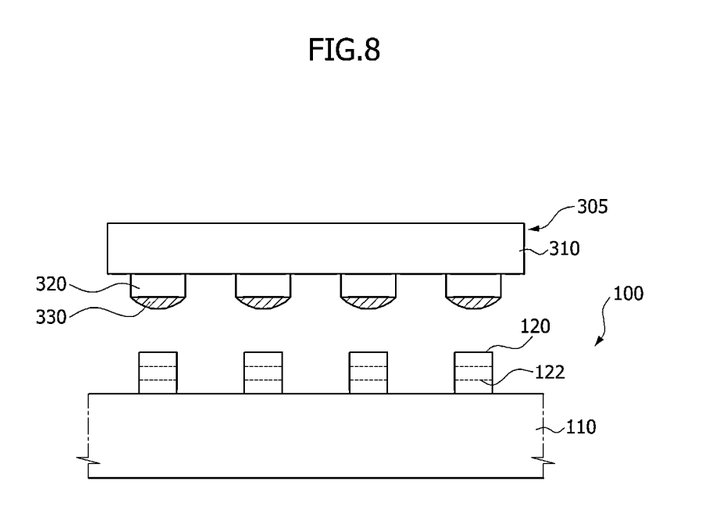
FIG. 8 is a cross sectional view illustrating a method of fabricating the semiconductor package illustrated in FIG. 3.

FIG. 8 is a cross sectional view illustrating a method of fabricating the semiconductor package illustrated in FIG. 3. Referring to FIG. 8, a substrate 100 may be provided. The substrate 100 may be provided to include a substrate body 110 and bumps 120, that may be substantially pillar-shaped and disposed on a first surface of the substrate body 110. Each of the bumps 120 may be formed to have a hole 122 that penetrates a portion thereof. The substrate 100 including the bumps 120 may be fabricated using substantially the same methods as described with reference to FIGS. 5, 6A, 6B, 7A and 7B. Subsequently, a semiconductor chip 305 may be provided, and conductive electrode patterns 320 may be formed on a first surface of the semiconductor chip 305. Adhesive agents 330 may be attached to first surfaces of the conductive electrode patterns 320 opposite to the chip body 310. In an embodiment, each of the conductive electrode patterns 320 may be formed to include a metal bump. Each of the adhesive agents 330 may be formed of a solder material.

The semiconductor chip 305 may then be substantially vertically aligned with the substrate 100, and at least one of the semiconductor chip 305 and the substrate 100 may be pressurized such that the adhesive agents 330 contact the bumps 120. During pressurization of the semiconductor chip 305 and/or the substrate 100, the adhesive agents 330 may be reflowed to bond the conductive electrode patterns 320 to the bumps 120. In an embodiment, the adhesive agents 330 may be reflowed at a temperature of about 200° C. to about 300° C. for about five minutes to about ten minutes. As a result of the reflowing process, the semiconductor package 300 illustrated in FIGS. 3A and 3B may be formed.

In various embodiments, the bumps 120 having the holes 122 may be formed on the semiconductor chip 305 and the conductive electrode patterns 320 may be formed on the substrate body 110, and the conductive electrode patterns 320 may be bonded to the bumps 120 through the adhesive agents 330 using the same reflowing process as described above. In such a case, the semiconductor package 400 illustrated in FIGS. 4A and 4B may be formed.

According to the embodiments set forth above, pillar-shaped bumps disposed on a substrate body (or a chip body) may be formed to have holes, and conductive electrode patterns may be formed on the chip body (or the substrate body). Thus, when the bumps having the holes are bonded to the conductive electrode patterns using adhesive agents to fabricate a semiconductor package, the adhesive agents may fill the holes. As a result, a bonding strength between the bumps and the conductive electrode patterns may be improved, and a thickness of the adhesive agents formed on sidewalls of the bumps may be minimized. Advantageously, electrical bridges or shortages between the adjacent bumps may be suppressed, and the adhesive agents may be formed to have a uniform shape after the bumps are bonded to the conductive electrode patterns. Accordingly, the bumps having the holes may lead to enhancement of the bonding reliability of a semiconductor package including the chip body and the substrate body.

The various embodiments of the inventive concept have been disclosed above for illustrative purposes. Those skilled in the art will appreciate that various modifications, additions, and substitutions are possible, without departing from the scope and spirit of the inventive concept as disclosed in the accompanying claims.

What is claimed is:

1. A substrate comprising:
   a substrate body; and
   a substantially pillar-shaped bump disposed on a first surface of the substrate body,
   wherein a hole extends through the pillar-shaped bump and is substantially parallel to the first surface, and
   wherein the area of the cross-section of the hole is smaller than the remaining area of the cross-section of the pillar-shaped bump.

2. The substrate of claim 1, wherein the substantially pillar-shaped bump includes a conductive material.

3. The substrate of claim 1, wherein the hole extends through and is surrounded by the substantially pillar-shaped bump.

4. A semiconductor chip comprising:
   a chip body; and
   a substantially pillar-shaped bump disposed on a first surface of the chip body,
   wherein a hole extends through the substantially pillar-shaped bump,
   wherein the hole is substantially parallel to the first surface, and
   wherein the area of the cross-section of the hole is smaller than the remaining area of the cross-section of the pillar-shaped bump.

5. The semiconductor chip of claim 4, wherein the substantially pillar-shaped bump includes a conductive material.

6. The semiconductor chip of claim 4, wherein the hole extends through and is surrounded by the substantially pillar-shaped bump.

7. A semiconductor package comprising:
   a substrate having a substrate body and a substantially pillar-shaped bump disposed on a first surface of the substrate body, wherein a hole extends through two sides of the substantially pillar-shaped bump hole and is substantially parallel to the first surface, wherein the area of the cross-section of the hole is smaller than the remaining area of the cross-section of the pillar-shaped bump;
   a semiconductor chip having a chip body and a conductive electrode pattern disposed on a first surface of the chip body; and
   an adhesive agent substantially filling the hole and bonding the conductive electrode pattern to the substantially pillar-shaped bump.

8. The semiconductor package of claim 7, wherein the conductive electrode pattern includes a bump.

9. The semiconductor package of claim 7, wherein the adhesive agent includes a solder material.

10. A semiconductor package comprising:
    a semiconductor chip having a chip body and a substantially pillar-shaped bump disposed on a first surface of the chip body, wherein a hole extends through the substantially pillar-shaped bump, wherein the hole is substantially parallel to the first surface, wherein the area of the cross-section of the hole is smaller than the remaining area of the cross-section of the pillar-shaped bump;
    a substrate having a substrate body and a conductive electrode pattern disposed on a first surface of the substrate body; and
    an adhesive agent substantially filling the hole and electrically coupling the conductive electrode pattern to the substantially pillar-shaped bump.

11. The semiconductor package of claim 10, wherein the conductive electrode pattern includes a bump.

12. The semiconductor package of claim 10, wherein the adhesive agent includes a solder material.

* * * * *